(12) United States Patent
Wilner (10) Patent No.: US 6,593,651 B1
(45) Date of Patent: Jul. 15, 2003

(54) TERMINALS FOR MULTI-LAYER DEVICES

(75) Inventor: Leslie Bruce Wilner, Palo Alto, CA (US)

(73) Assignee: Endevco Corporation, San Juan Capistrano, CA (US)

( * ) Notice: Subject to any disclaimer, the term of this patent is extended or adjusted under 35 U.S.C. 154(b) by 0 days.

(21) Appl. No.: 10/060,927

(22) Filed: Jan. 30, 2002

(51) Int. Cl.[7] ................................................. H01L 23/12
(52) U.S. Cl. ....................... 257/704; 257/108; 257/419; 257/710; 257/748; 257/750
(58) Field of Search ................................. 257/704, 709, 257/710, 758, 750, 748, 760, 768, 769, 108, 419

(56) References Cited

U.S. PATENT DOCUMENTS 5,095,349 A * 3/1992 Fujii et al. .................. 257/108
5,296,730 A * 3/1994 Takano et al. .............. 257/417
5,320,705 A * 6/1994 Fujii et al. .................... 438/51
6,278,167 B1 * 8/2001 Bever et al. ................. 257/415

* cited by examiner

*Primary Examiner*—Hoai Ho
*Assistant Examiner*—Andy Huynh
(74) *Attorney, Agent, or Firm*—Hamilton, Brook, Smith & Reyonolds, P.C.

(57) ABSTRACT

A multi-layer device with a lid, a core, and a base. The lid has a first terminal and a second terminal, and an inner surface with a first insulator. The core has a first surface bonded to the first insulator and a second surface bonded to a second insulator, and includes a pillar electrically connected to the second terminal. The base has an inner surface bonded to the second insulator and a portion being electrically connected to the pillar. The first terminal of the lid and the base are adapted for electrically connecting to an interior electrical unit positioned within the core so that there are conductive paths from the electrical unit to the first and second terminals. The lid can include a third terminal in electrical contact with a portion of the core, and the portion of the core can be adapted for electrically connecting to the electrical unit.

35 Claims, 8 Drawing Sheets

FIG. 6

TERMINALS FOR MULTI-LAYER DEVICES

BACKGROUND

In certain applications, electrical devices or sensors are used to measure or detect various operating or performance parameters such as, for example, temperature, pressure, or acceleration. These devices can be actuators or electronic devices such as magnetic field sensors. Typically, the electrical functions of the devices are communicated to support electronics and/or some recording apparatus that allows an operator to monitor the parameters being measured by the sensors. In many instances, the device is provided with terminals which are simply connected to lead wires extending from the support electronics or recording apparatus.

Some electronic devices are made of multiple layers of semiconductor material. These devices or sensors typically include an interior operating unit. The electrical function of the unit may occur at various layers of the device which must be connected to the external electronics. For example, lead wires may be connected to interior terminals on one or more surfaces of the interior operating unit, and then fed through access holes in the layers to the outside of the device. However, when electrical functions are communicated from surfaces on opposite sides, for example, an upward and a downward surface, of the interior operating unit, wiring to the unit becomes inconvenient during the assembly process.

Some assembly processes use a "flip-chip" technique in which the inner terminals of the interior operating unit are presented on one surface. Patterns of conductor lines extend from the inner terminals up an insulated surface of a semiconductor layer that is adjacent to the interior operating unit to an outer surface of the semiconductor layer. It has been proposed to electrically connect the interior operating unit to the outside by using metal thin films that coat oxide-insulated holes of semiconductor layers positioned next to the interior operating unit. Such connections, however, introduce large capacitance coupling which can be troublesome, for example, for systems working at radio frequencies. Furthermore, extending the conductor lines through several layers is not easily accomplished.

SUMMARY

The present invention implements a device which encloses an interior electrical or operating unit while facilitating the transmission of electrical signals from the interior unit to a location outside of the device. The interior unit can be hermetically sealed within the device to protect the unit from the outside environment. The device includes two or more internal terminals connected to the interior unit and provides respective conductive paths from the internal terminals to two or more outer terminals located on the outer surface of the device.

In one embodiment, a multi-layer device includes a lid, a core, and a base. The lid has a first outer terminal and a second outer terminal, and a first insulator having a first surface bonded to the lid. The insulator also includes a first inner terminal located on a second surface for connecting to an interior operating unit, and a first etch pit that electrically connects the first outer terminal to the first inner terminal, and a second etch pit that is electrically connected to the second outer terminal. The core has a first surface bonded to the second surface of the first insulating layer and includes a pillar electrically connected to the second etch pit of the first insulator. A second insulator includes a first surface bonded to a second surface of the core and a second inner terminal located on that first surface also for connecting to the interior operating unit. The second insulator also includes a third etch pit electrically connected to the second inner terminal, and a fourth etch pit electrically connected to the pillar. The device is also provided with a base having a cap electrically connected to the third and fourth etch pits. Accordingly, there is a first conductive path defined from the first outer terminal of the lid through the first etch pit to the first inner terminal, and a second conductive path defined from the second outer terminal of the lid through the second etch pit, the pillar, the fourth etch pit, the cap, and the third etch pit to the second inner terminal.

The lid, the base, and the core can be made of silicon, and the first and second insulators can be made of Pyrex. In some embodiments, the electrical unit is hermetically sealed within the device. The first and second outer terminals can be coated with a conductive metal such as, for example, gold or platinum. Additionally, the etch pits and the inner terminals can be made from a conductive metal.

In certain embodiments, the lid further includes a third outer terminal, the first insulator includes a fifth etch pit, and a portion of the core serves as a third inner terminal so that there is a third conductive path defined from the third outer terminal, through the fifth etch pit to the third inner terminal.

In other embodiments, the lid further includes a fourth outer terminal, the first insulator includes a sixth etch pit, the core includes a second pillar, the second insulator includes a seventh etch pit, and the base includes a fifth outer terminal. In such embodiments, a fourth conductive path is defined from the fourth outer terminal through the sixth etch pit, the second pillar, and the seventh etch pit to the fifth outer terminal. The fourth outer terminal can be electrical connected to a portion of the lid, and the fifth outer terminal can be electrically connected to a portion of the base so that the portions of the lid and base, and the fourth and fifth outer terminals serve as guard electrodes.

In another embodiment, a multi-layer device includes a lid, a core, and a base. The lid has a first terminal and a second terminal, and an inner surface with a first insulator. The core has a first surface bonded to the first insulator and a second surface bonded to a second insulator, and includes a pillar electrically connected to the second terminal. The base has an inner surface bonded to the second insulator and a portion being electrically connected to the pillar. The first terminal of the lid, as well as the base, are adapted for electrically connecting to an interior electrical unit positioned within the core so that there are conductive paths to the first and second terminals. The lid can include a third terminal in electrical contact with a portion of the core, and the portion of the core can be adapted for electrically connecting to the electrical unit.

In any of the embodiments described above, the device can include the interior operating unit which is electrically connected to the internal terminals.

Related embodiments of the invention include a device with a lid having a first outer terminal and a second outer terminal, a base, and an interior operating unit having a first inner terminal electrically connected through the lid to the first outer terminal, and a second inner terminal electrically connected through the lid to the second outer terminal. The interior operating unit is hermetically sealed between the lid and the base.

Other embodiments include methods of making a device for electrically connecting an electrical unit enclosed within the device to the outside of the device. The methods can include a photochemical etching process to form the outer terminals and the pillars. The lid, the base, and the core can be bonded to the insulators with an anodic bonding process or a solder bonding process. Multiple devices can be made from wafers of semiconductor and insulator material bonded together. The individual devices are sawed apart from the wafers to form the individual devices thereby physically isolating the pillar of each device.

Some embodiments of the invention may have one or both of the following advantages. The conductive paths can extend through multiple layers of a multi-layer structure. The conductive paths can be separated by wide air gaps, which introduce only a small capacitance.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
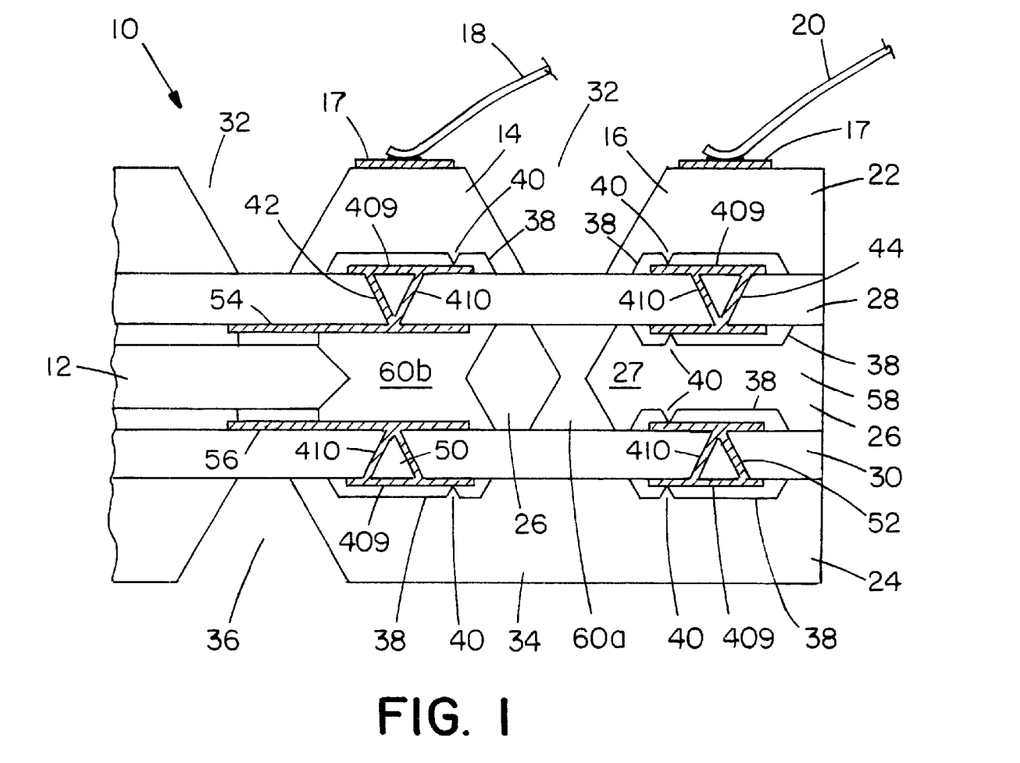
FIG. 1 is a cross-sectional view of a multi-layer silicon device with terminals in accordance with the invention.
Figure 2A:
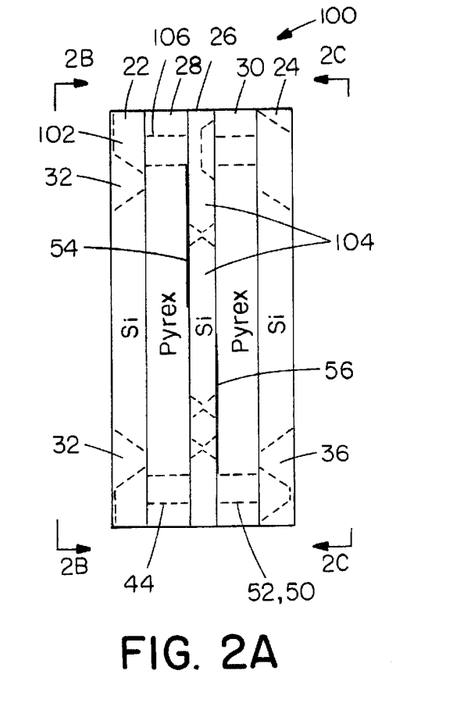
FIG. 2A is a side view of a multi-layer silicon device with internal terminals connected to an electrical unit enclosed within the device in accordance with the invention.
Figure 2B:
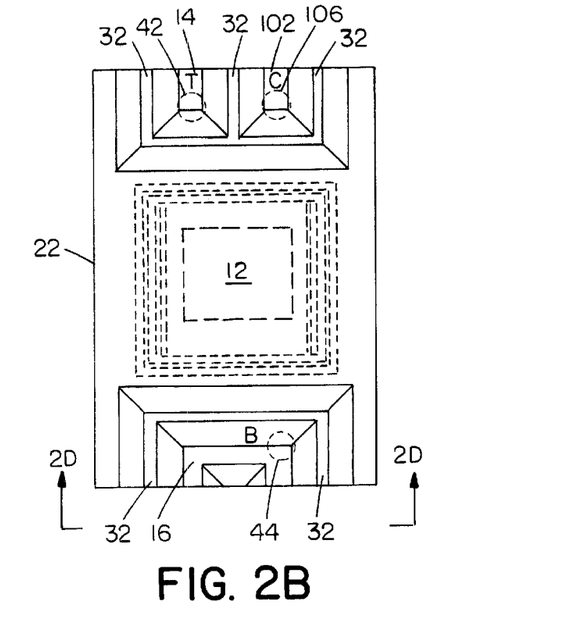
FIG. 2B is a top view of the device along the line 2B—2B of FIG. 2A.
Figure 2C:
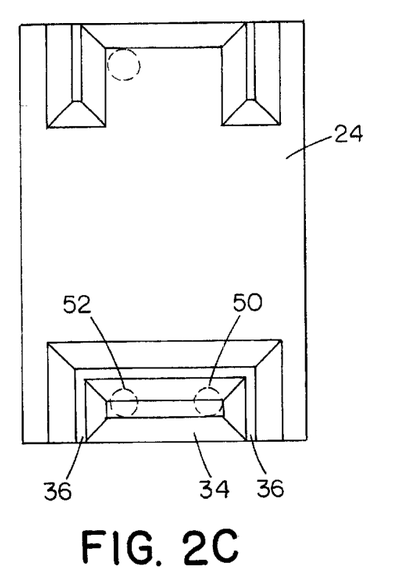
FIG. 2C is a bottom view of the device along the line 2C—2C of FIG. 2A.
Figure 2D:
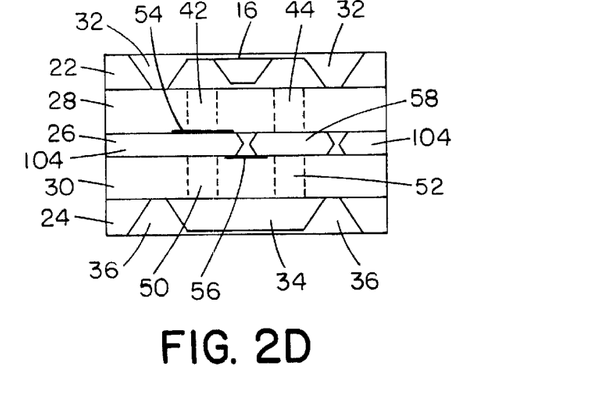
FIG. 2D is an end view of the device along the line 2D—2D of FIG. 2B.
Figure 3A:
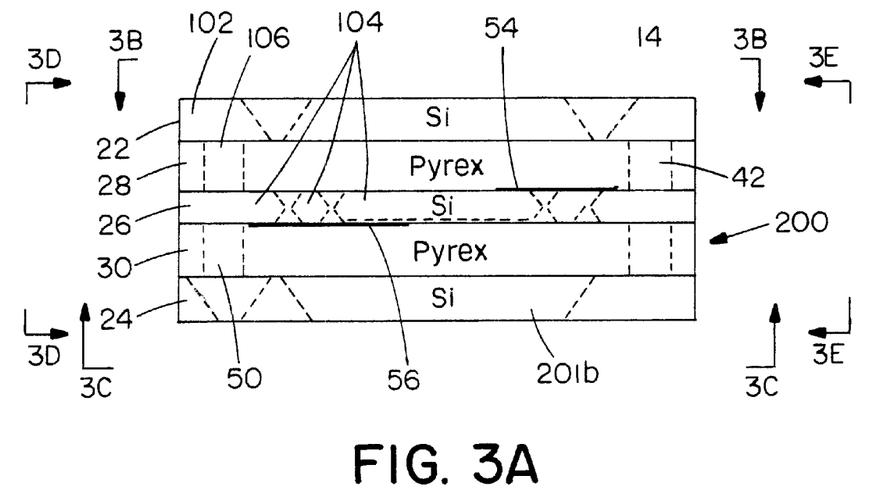
FIG. 3A is a side of an alternative embodiment of the multi-layer silicon device with internal terminals in accordance with the invention.
Figure 3B:
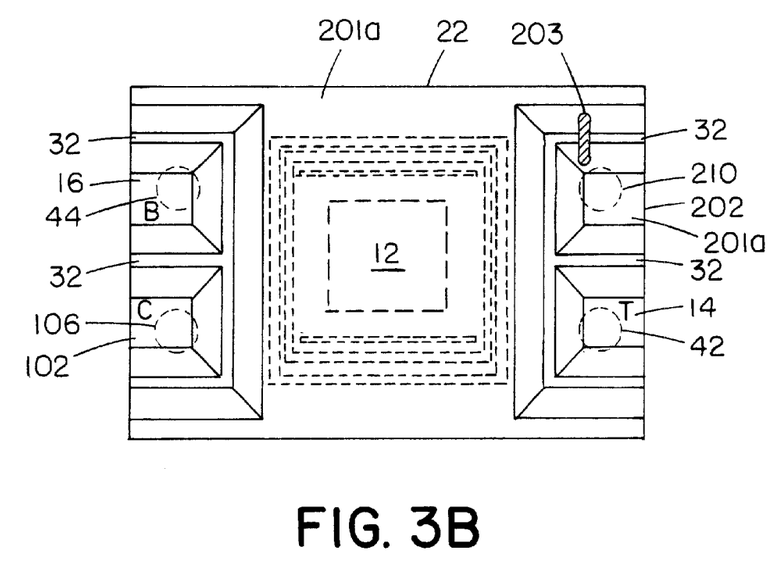
FIG. 3B is a top view of the device along the line 3B—3B of FIG. 3A.
Figure 3C:
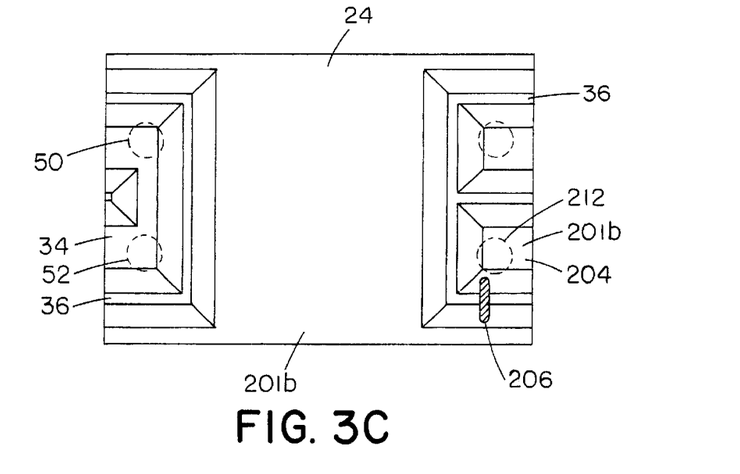
FIG. 3C is a bottom view of the device along the line 3C—3C of FIG. 3A.
Figure 3D:
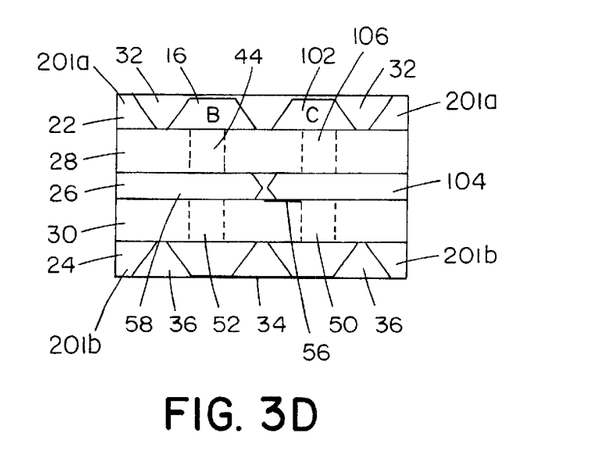
FIG. 3D is an end view of the device along the line 3D—3D of FIG. 3A.
Figure 3E:
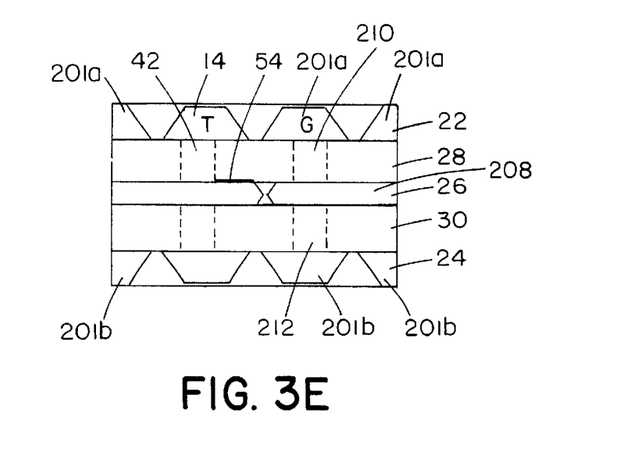
FIG. 3E is an end view of the device along the line 3E—3E of FIG. 3A.
Figure 4A:
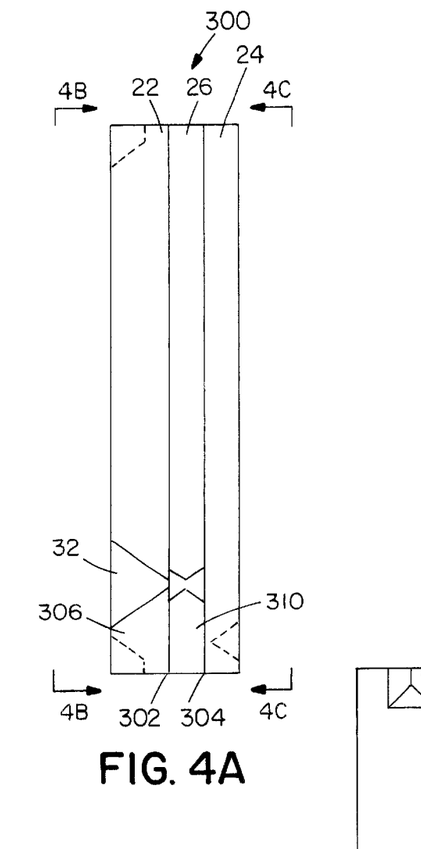
FIG. 4A is a side view of another alternative embodiment of the multi-layer silicon device with internal terminals in accordance with the invention.
Figure 4B:
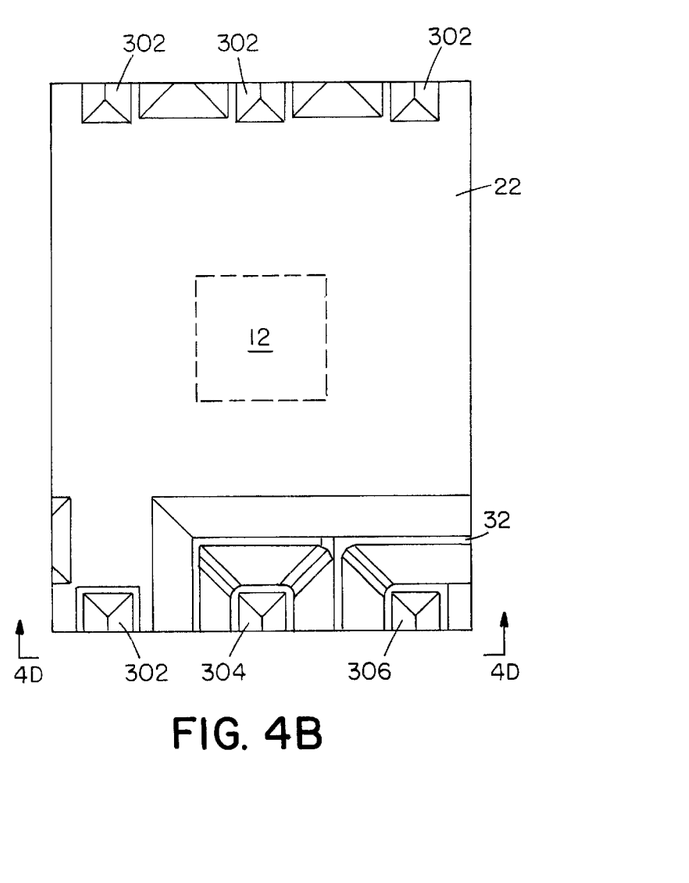
FIG. 4B is a top view of the device along the line 4B—4B of FIG. 4A.
Figure 4C:
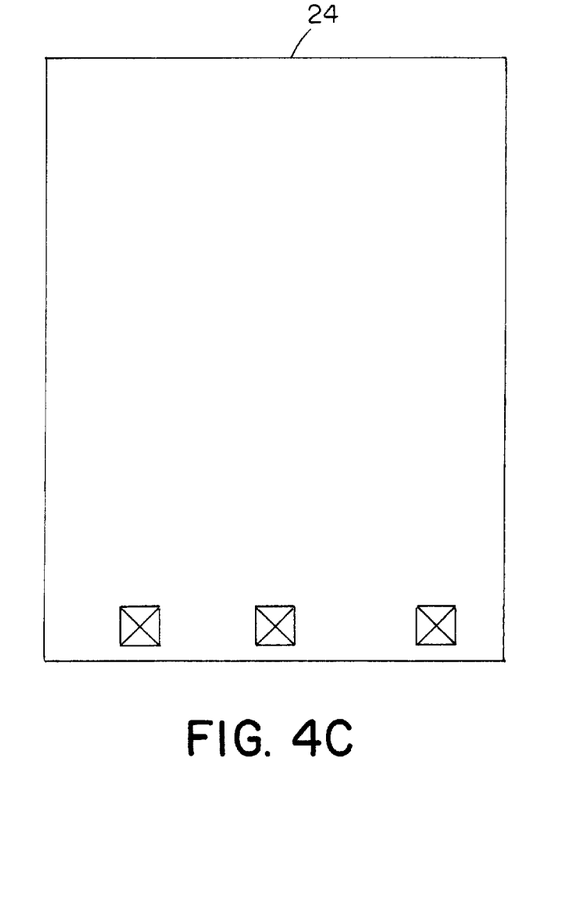
FIG. 4C is a bottom view of the device along the line 4C—4C of FIG. 4A.
Figure 4D:
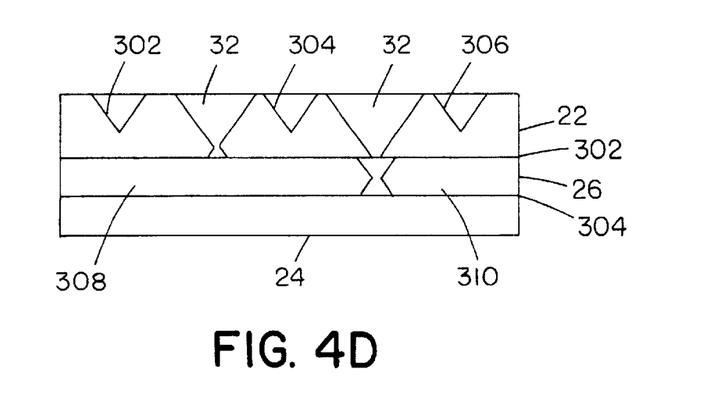
FIG. 4D is an end view of the device along the line 4D—4D of FIG. 4B.

Referring to FIG. 1, there is shown a two-terminal multilayer device 10 which encloses an interior electrical unit 12. The device 10 can be a sensor to measure, for example, temperature, pressure, or acceleration. The device 10 can also be used as an actuator or as some other electronic device such as a magnetic field sensor. Electrical signals are transmitted to and from the interior unit 12 to the outside of the device 10 through the two outer terminals 14 and 16 that are coated with a thin layer of metal 17. The metal layer 17 on each outer terminal 14 and 16 can be connected, for example, to a pair of lead wires 18 and 20, respectively, which extend to a monitor, recording apparatus, and/or support electronics. A particular feature of the device 10 is that the interior unit 12 can be hermetically sealed within the device 10 to protect the interior unit 12 from the outside environment.

The device 10 includes a lid 22, a base 24, and a core 26 made from, for example, silicon. The lid 22 and the base 24 are each bonded to an outer surface of a respective layer of Pyrex 28 and 30, or any other suitable insulating material, while the inner surfaces of the Pyrex layers 28 and 30 are bonded to the opposite sides of the core 26.

The outer terminals 14 and 16 are essentially isolated islands separated physically and electrically from the remainder of the lid 22 by a set of trenches 32. Similarly, the base 24 is provided with a cap 34 that is physically and electrically separated from the rest of the base 24 by one or more trenches 36.

Figure 5A:
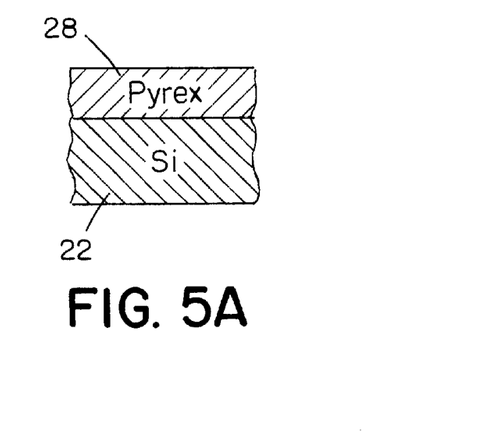
FIGS. 5A–5F are schematics of a sequence of steps to fabricate an etch pit of the devices in accordance with the invention.
Figure 5B:
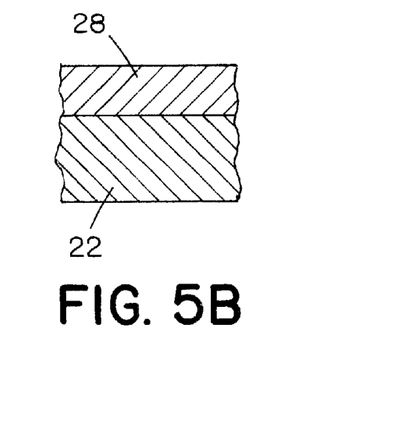
Figure 5C:
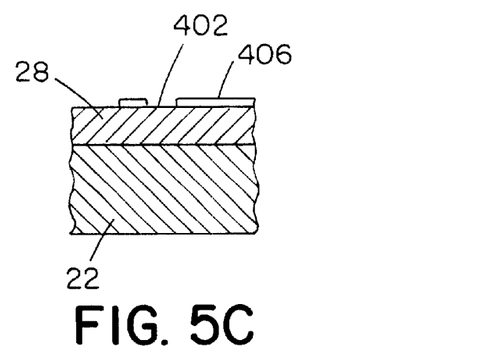
Figure 5D:
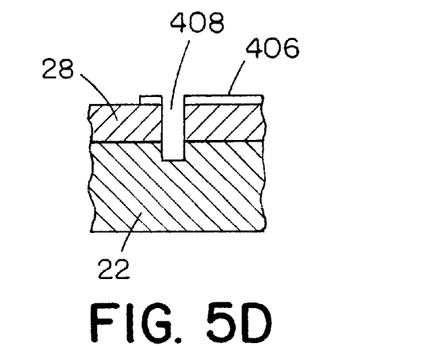
Figure 5E:
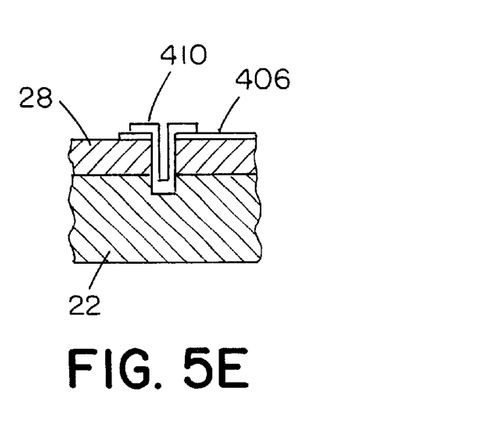
Figure 5F:
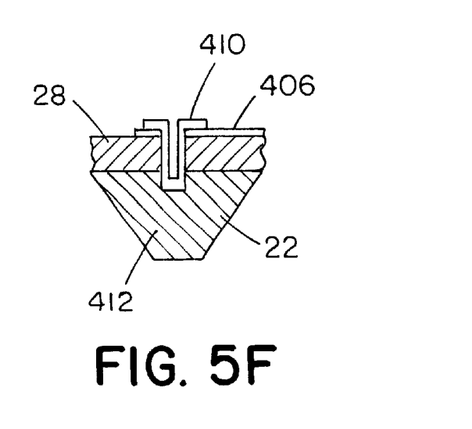

Optionally, each of the terminals 14 and 16 has a recessed region 38 provided with a protrusion 40. The protrusions 40 of the terminals 14 and 16 are in electrically contact with a first etch pit 42 and a second etch pit 44 of the Pyrex layer 28, respectively. The cap 34 and the core 26 are also provided with the recessed regions 38 and protrusions 40 such that the cap 34 is electrically connected to a first etch pit 50 and a second etch pit 52 of the second layer of Pyrex 30, while a portion of the core 27 is electrically connected to the second etch pit 44 of the Pyrex layer 28, and the second etch pit 52 of the second Pyrex layer 30. The first etch pits 42 and 50 are further electrically connected to a pair of inner thin-film terminals 54 and 56 that coat the inner surfaces of the layers of Pyrex 28 and 30, respectively. The protrusions 40 ensure a controlled area of contact between the etch pits and the adjacent layer of silicon. Alternatively, the terminals 14 and 16, the core 26, and the cap 34 do not have a recessed region. Rather, they can be in direct contact with a respectively layer Pyrex. For example, there is shown in FIG. 5F an outer terminal without a recessed region.

Accordingly, when the device 10 is assembled, there is an electrical path from the first terminal 14 through the first etch pit 42 of the Pyrex layer 28 to the inner terminal 54. There is also a second electrical path from the second terminal 16 through the second etch pit 44 of the Pyrex layer 28 to a pillar 58 of the core 26. The pillar 58 is electrically isolated from the remainder of the core 26 by a gap 60 so that the second electrical path continues through the second etch pit 52 of the Pyrex layer 30, across the cap 34, up the first etch pit 50 of the Pyrex layer 30, and finally to the terminal 56.

With the inner terminals 54 and 56 connected to the interior unit 12 which is electrically isolated from the core 26 by a gap 60b, electrical signals to and from the interior unit 12 are communicated to the outside of the device 10 via the outer terminals 14 and 16.

The lid 22, base 24, and core 26 and the two layers of Pyrex 28 and 30 are each about 0.4 mm thick, and the device 10 itself is about 2 mm thick, 2.5 mm long, and 1 mm wide.

The thin layer of metal 17 on each of the terminals 14 and 16 is made from any suitable conductive material such as, for example, gold or platinum, and has a thickness of about 1 micron. The etch pits 42, 44, 50, and 52 are also coated with a thin layer of metal of about 1 micron which makes the electrical connection through the respective layer of Pyrex 28 and 30, and the inner terminals 54 and 56 are about 0.75 micron thick. As with the terminals 14 and 16, the metal for the etch pits 42, 44, 50, and 52 and the inner terminals 54 and 56 can be made any suitable conductive material such as gold or platinum. The metal for etch pits 42, 44, 50, and 52 can also be a base metal such as aluminum.

The embodiment shown in FIG. 1 is a two-terminal device. However, other embodiments can be used to enclose the interior unit 12. For example, there is shown in FIGS. 2A–2D a three-terminal device 100 that is made of the three silicon layers, the lid 22, the base 24, and the core 26, as well as the two insulating layers of Pyrex 28 and 30. Similar to the device 10 shown in FIG. 1, the device 100 is provided with two outer terminals 14 and 16 which are electrically isolated from the rest of the lid 22 by a set of trenches 32. Accordingly, there is an electrically conductive path from the first terminal 14 to the inner terminal 54 through the etch pit 42 of the layer of Pyrex 28, and another conductive path from the second terminal 16 through the second etch pit 44 of the Pyrex layer 28 to the pillar 58 of the core silicon layer 26, and then from the pillar 58 through the second etch pit 52 of the second layer of Pyrex 30, across the cap 34 electrically isolated from the remainder of the base 30 by the trenches 36, up the first etch pit 50 of the Pyrex layer 30, and to the inner terminal 56 that coats the inner surface of the Pyrex layer 30. Typically, the regions of the core 26 adjacent the inner terminals 54 and 56 are recessed so that those regions are not in direct contact with the inner terminals 54 and 56.

The device 100 also includes a third terminal 102 electrically isolated from the lid 22 by the trenches 32 and coated with a thin layer of metal such as the metal layer 17 shown in FIG. 1. In this embodiment, a portion 104 of the core 26 functions as a third inner terminal. The portion 104 includes all of the core layer 26 except that which is isolated as the pillar 58, and is electrically connected to the third terminal 102 of the lid 22 through a third etch pit 106 of the Pyrex layer 28. Hence, with the device 100, electrical functions to and from the interior unit 12 are transmitted between the three inner terminals 54, 56, and 104 connected to the interior unit 12 and the outside of the device 100 via the outer terminals 14, 16, and 102 along the respective conductive paths between the inner terminals and the outer terminals. Additionally, the region of the lid 22 isolated from the outer terminals 14, 16, and 102 can serve as another terminal, for example, by providing that region with its own metal film terminal. Similarly, the base 24 that is isolated from the cap 34 can also serve as an additional terminal by making connections to that isolated portion with a metal film terminal.

Referring now to FIGS. 3A–3E, there is shown a four-terminal device 200. As with the device 100, the device 200 includes three outer terminals 14, 16, and 102 connected along a respective conductive path to the three inner terminals 54, 56, and 104, the paths being identically labeled to those shown in FIGS. 2A–2D. However, in this configuration, the lid 22 includes a fourth terminal 202. Although the fourth terminal 202 is isolated from the rest of the lid 22 by the trenches 32, there is a metal film connector 203 that electrically connects the fourth terminal 202 to the portion 201a. Similarly, the base 24 includes a terminal 204, isolated by the trenches 36, electrically connected to the portion 201b of the base with a connector 206. Further, there is an electrical path from the lid 22 to a second pillar 208 of the core 26 through a fourth etch pit 210 of the Pyrex layer 28, and from the second pillar 208 to the base 24 via a third etch pit 212 of the Pyrex layer 30. Thus, the portion 201a and the outer terminal 202 of the lid 22 is electrically connected to the portion 201b and the outer terminal 204 of the base 24 such that they serve as guard electrodes.

In other embodiments, rather than using layers of Pyrex to insulate the lid 22, the base 24, and the core 26 from each other, other types of insulators can be used. For instance, there is shown in FIGS. 4A–4D a three-terminal device 300 with the lid 22 separated from the core 26 by a thin oxide layer 302, while the base 24 is separated from the core 26 by a second thin oxide layer 304. In this embodiment, the oxide layers 302 and 304 are made of $SiO_2$, for example, and have a thickness of about 1.2 to 1.4 microns.

The lid 22 of the device 300 is provided with a set of outer terminals 302 and two other outer terminals 304 and 306. The terminals 304 and 306 are islands separated from the rest of the lid 22 by the trenches 32, while the terminals 302 are electrically connected across the rest of the lid 22. That is, the entire portion of the lid 22 isolated from the terminals 304 and 306 function as a terminal.

The core 26 is provided with a portion 308 and a pillar 310. The portion 308 is electrically continuous throughout the core 26 except for the isolated pillar 310, and includes a sealed rim that surrounds the interior unit 12. The oxide layer between the terminal 304 and the portion 308 is interrupted with a metal film to provide a conductive path between the terminal 304 and the portion 308. Hence, the portion 308 functions as an inner terminal which is electrically connected to the terminals 304. In addition, the layer of oxide on either side of the pillar 310 is interrupted with a respective metal film such that there is a conductive path from the terminal 306 through the pillar 310 to the base 24 itself. The interior unit 12 is directly connected to the outer terminal 302, as well as the portion 308, and the base 24, and hence to the terminals 304 and 306, respectively.

Referring now to FIGS. 5A–5F, there is shown a sequence of illustrated steps to fabricate an etch pit through a layer of Pyrex such as the layer 28. First (FIG. 5A), the Pyrex layer 28 is bonded to a layer of silicon, for example, the lid 22, by anodic bonding. This bonding process uses heat and electricity, and optionally pressure, so that an electrical charge attracts the Pyrex to the silicon and the physical contact between the two layers causes a chemical reaction with the Pyrex. At the interface, the Pyrex is reduced and the silicon is oxidized. The newly formed oxide is as adherent to the silicon as thermally grown oxide, and is continuous with the Pyrex.

Next (FIG. 5B), the Pyrex 28 is optionally polished to clean its outer surface. Subsequently (FIG. 5C), a metal layer 406 is applied to this surface, and a photochemical etching process is used to create the desired pattern with the appropriate openings 407.

Then (FIG. 5D) through the openings 407 an impact grinder is used to pierce the Pyrex 28 to create the holes 408. The impact grinder is an ultrasonic tool shaped with protrusions located where holes in the Pyrex are desired. The impact grinder uses ultrasonic vibrations to grind the Pyrex into a slurry that is flushed away.

Next (FIG. 5E), another layer of metal 410 is applied to electrically connect the first layer of metal 407 to the lid 22. Finally (FIG. 5F), another photochemical etching process is used to created the isolated islands 412 which serve as the terminals of the lid 22.

In other embodiments, the layer of Pyrex is preformed with the desired holes before it is bonded to the layer of silicon, and then after the bonding process, the layer of metal is applied to make the electrically connection from one side of the Pyrex to the other side of the Pyrex adjacent to the layer of silicon. As shown in FIGS. 5D through 5F, the hole 408 of the etch pit is cylindrical. Alternatively, the holes can have a conical shape, for example, as shown in FIG. 1. The conical holes for the etch pits 42, 44, 50, and 52 can be produced with an photochemical etching process. The surface of the holes are then coated with the metal layer 410 to electrically connect to a layer of metal 409 in contact with the protrusions 40.

Figure 6:
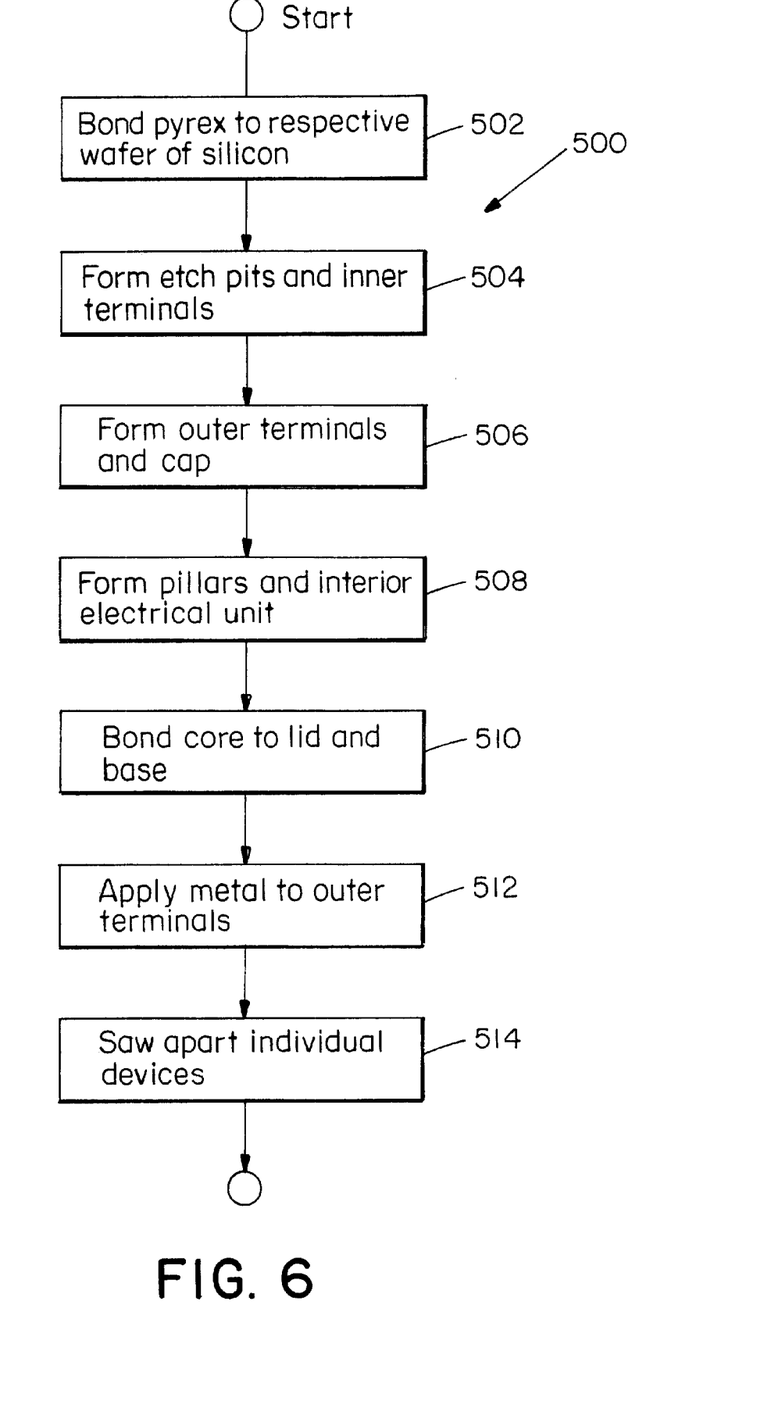
FIG. 6 is a flow diagram of a sequence of steps to fabricate the device in accordance with the invention.

Referring now to FIG. 6, there is shown a flow diagram of a sequence of steps 500 to make the devices 10, 100, or 200.

First, in a step 502, a wafer of Pyrex is bonded to a wafer of silicon from which the lid 22 or the base 24 are formed. Next, in a step 504, the etch pits are formed as described earlier. The desired holes in the wafers of Pyrex can be preformed or they can be made with the ultrasonic grinding process described above. In addition, a layer of metal is applied to the inner surfaces of the Pyrex wafers to form the inner terminals 54 and 56.

Then, in a step 506, the silicon wafers are put through a photochemical etching process to form the outer terminals in the lid 22 or the base 24, as well as the cap 34 of the base 24.

Subsequently, in a step 508, another photochemical etching process is used to form the appropriate pillars of the core 26 from another wafer of silicon. The interior operating unit 12 is also fabricated during this step.

Next, in a step 510, the core 26 is bonded to the two layers of Pyrex 28 and 30. Then, in a step 512, metal is selectively applied to the outer terminals.

Finally, in a step 514, the desired device is sawed or cut away from the rest of the silicon and Pyrex wafers. Note, that typically about 40 to 1000 individual devices can be formed from these wafers. That is, each of the devices is essentially a die in the wafers during the fabrication process. Although the pillars are originally projections from a neighboring die, the sawing process cuts the pillar free from the neighbor thereby forming the isolated pillars of the individual devices bonded only to adjacent layers of that particular device.

The process to form the device 300 shown in FIGS. 4A–4D is somewhat different than that illustrated in FIG. 6. To fabricate the device 300, the oxide layers 302 and 304 are first applied to the respective layers of silicon which ultimately form the lid 22 and the base 24. Then, a third wafer of silicon is subjected to a photochemical etching process to form the pillar of the core 26. The lid 22 is also etched to form the isolated regions in the lid 22 which serve as the outer terminals.

Subsequently, the lid 22, the base 24, and the core 26 are bonded together with a solder bonding process. That is, a metal film, such as, for example, a gold film, is applied only where a conductive path is desired between the various layers. Upon being heated, this film layer melts and sticks or fuses to the layers, thereby bonding the layers together. Finally, the conductive metal layer 17 is applied to certain isolated regions of the lid 22 to metalize the outer terminals.

While this invention has been particularly shown and described with references to preferred embodiments thereof, it will be understood by those skilled in the art that various changes in form and details may be made therein without departing from the scope of the invention encompassed by the appended claims.

What is claimed is:

1. A device for connecting to an electrical unit enclosed within the device, comprising:

a lid having a first outer terminal and a second outer terminal;

a first insulator having a first surface bonded to the lid and a first inner terminal located on a second surface, and including a first etch pit electrically connecting the first outer terminal to the first inner terminal, and a second etch pit electrically connected to the second outer terminal;

a core having a first surface bonded to the second surface of the first insulating layer and including a pillar electrically connected to the second etch pit of the first insulator;

a second insulator having a first surface bonded to a second surface of the core and a second inner terminal located on that first surface, and including a third etch pit electrically connected to the second inner terminal, and a fourth etch pit electrically connected to the pillar; and a base having a cap electrically connected to the third and fourth etch pits, the first and second inner terminals being adapted for connecting to the electrical unit.

2. The device of claim 1, wherein the lid, the base, and the core are made of silicon.

3. The device of claim 1, wherein the first and second insulators are made of Pyrex.

4. The device of claim 1, wherein the electrical unit is hermetically sealed within the device.

5. The device of claim 1, wherein the first and second terminals are coated with a conductive metal.

6. The device of claim 5, wherein the metal is gold.

7. The device of claim 5, wherein the metal is platinum.

8. The device of claim 1, wherein the etch pits and the inner terminals are made from a conductive metal.

9. The device of claim 8, wherein the metal is gold.

10. The device of claim 8, wherein the metal is platinum.

11. The device of claim 1, wherein the etch pits are made from aluminum.

12. The device of claim 1, wherein the lid includes a third outer terminal, the first insulator includes a fifth etch pit, and a portion of the core serves as a third inner terminal adapted for connecting to the electrical unit, a conductive path being defined from the third outer terminal, through the fifth etch pit to the third inner terminal.

13. The device of claim 12, wherein the lid includes a fourth outer terminal, the first insulator includes a sixth etch pit, the core includes a second pillar, the second insulator includes a seventh etch pit, and the base includes a fifth outer terminal, a second conductive path being defined from the fourth outer terminal through the sixth etch pit, the second pillar, and the seventh etch pit to the fifth outer terminal, the fourth outer terminal being electrical connected to a portion of the lid, and the fifth outer terminal being electrically connected to a portion of the base so that the portions of the lid and base, and the fourth and fifth outer terminals serve as guard electrodes.

14. A device for connecting to an electrical unit enclosed within the device, comprising:

a lid having a first terminal and a second terminal, and an inner surface with a first insulator;

a core having a first surface bonded to the first insulator and a second surface bonded to a second insulator, and including a pillar electrically connected to the second terminal; and a base having an inner surface bonded to the second insulator and a portion being electrically connected to the pillar, the lid and the base being adapted for electrically connecting to the electrical unit.

15. The device of claim 14, wherein the lid, the base, and the core are made of silicon.

16. The device of claim 14, wherein the first and second insulators are made of $SiO_2$.

17. The device of claim 14, wherein the electrical unit is hermetically sealed within the device.

18. The device of claim 14, wherein the lid includes a third terminal in electrical contact with a portion of the core, the portion of the core being adapted for electrically connecting to the electrical unit.

19. The device of claim 18, wherein the first, second, and third terminals are coated with a conductive metal.

20. The device of claim 19, wherein the metal is gold.

21. The device of claim 19, wherein the metal is platinum.

22. A device, comprising:

a lid having a first outer terminal and a second outer terminal;

a first insulator having a first surface bonded to the lid and a first inner terminal located on a second surface, and including a first etch pit electrically connecting the first outer terminal to the first inner terminal, and a second etch pit electrically connected to the second outer terminal;

a core having a first surface bonded to the second surface of the first insulating layer and including a pillar electrically connected to the second etch pit of the first insulator;

a second insulator having a first surface bonded to a second surface of the core and a second inner terminal located on that first surface, and including a third etch pit electrically connected to the second inner terminal, and a fourth etch pit electrically connected to the pillar;

a base having a cap electrically connected to the third and fourth etch pits; and an electrical unit positioned between the lid and the base and electrically connected to the first and second inner terminals.

23. The device of claim 22, wherein the lid, the base, and the core are made of silicon.

24. The device of claim 22, wherein the first and second insulators are made of Pyrex.

25. The device of claim 22, wherein the electrical unit is hermetically sealed within the device.

26. The device of claim 22, wherein the first and second terminals are coated with a conductive metal.

27. The device of claim 26, wherein the metal is gold.

28. The device of claim 26, wherein the metal is platinum.

29. The device of claim 22, wherein the etch pits and the inner terminals are made from a conductive metal.

30. The device of claim 29, wherein the metal is gold.

31. The device of claim 29, wherein the metal is platinum.

32. The device of claim 22, wherein the etch pits are made from aluminum.

33. The device of claim 22, wherein the lid includes a third outer terminal, the first insulator includes a fifth etch pit, and a portion of the core serves as a third inner terminal electrically connected to the electrical unit, a conductive path being defined from the third outer terminal, through the fifth etch pit to the third inner terminal.

34. The device of claim 33, wherein the lid includes a fourth outer terminal, the first insulator includes a sixth etch pit, the core includes a second pillar, the second insulator includes a seventh etch pit, and the base includes a fifth outer terminal, a second conductive path being defined from the fourth outer terminal through the sixth etch pit, the second pillar, and the seventh etch pit to the fifth outer terminal, the fourth outer terminal being electrical connected to a portion of the lid, and the fifth outer terminal being electrically connected to a portion of the base so that the portions of the lid and base, and the fourth and fifth outer terminals serve as guard electrodes.

35. A device, comprising:

a lid having a first outer terminal and a second outer terminal;

an interior operating unit having a first inner terminal electrically connected through the lid to the first outer terminal, and a second inner terminal electrically connected through the lid to the second outer terminal; and a base, the interior operating unit being hermetically sealed between the lid and the base.

* * * * *